(12) United States Patent
Maeda (10) Patent No.: US 7,888,866 B2
(45) Date of Patent: Feb. 15, 2011

(54) LIGHT-EMITTING DEVICE

(75) Inventor: Tsuyoshi Maeda, Kai (JP)

(73) Assignee: Seiko Epson Corporation, Tokyo (JP)

( * ) Notice: Subject to any disclaimer, the term of this patent is extended or adjusted under 35 U.S.C. 154(b) by 496 days.

(21) Appl. No.: 11/354,883

(22) Filed: Feb. 16, 2006

(65) Prior Publication Data

US 2006/0214572 A1 Sep. 28, 2006

(30) Foreign Application Priority Data

Mar. 25, 2005 (JP) .............................. 2005-087925

(51) Int. Cl.
*H05B 33/02* (2006.01)
*H01J 1/62* (2006.01)
(52) U.S. Cl. .................. 313/506; 313/504; 313/505
(58) Field of Classification Search ......... 313/495–512, 313/116; 315/169.3, 169.4; 257/40, 79; 428/690; 345/30, 36, 44, 45; 362/355; 359/599
See application file for complete search history.

(56) References Cited

U.S. PATENT DOCUMENTS

| | | | |
|---|---|---|---|
| 4,774,435 A * | 9/1988 | Levinson .................... 313/509 |
| 5,294,288 A * | 3/1994 | Melpolder et al. ........ 427/163.1 |
| 5,777,710 A * | 7/1998 | Okada et al. ................. 349/138 |
| 6,971,938 B2 | 12/2005 | Urabe et al. |
| 7,144,752 B2 | 12/2006 | Yotsuya |
| 7,598,669 B2 | 10/2009 | Toguchi et al. |
| 2002/0051423 A1 * | 5/2002 | Hayashida et al. .......... 369/286 |
| 2003/0057417 A1 * | 3/2003 | Lee et al. ..................... 257/40 |
| 2003/0107314 A1 * | 6/2003 | Urabe et al. ................. 313/506 |
| 2004/0017152 A1 * | 1/2004 | Hashimoto et al. .......... 313/505 |
| 2004/0166362 A1 * | 8/2004 | Utsumi et al. ................ 428/690 |
| 2004/0184154 A1 * | 9/2004 | Ito ............................... 359/599 |
| 2004/0227462 A1 * | 11/2004 | Utsumi et al. ................ 313/506 |
| 2004/0239240 A1 * | 12/2004 | Kato ............................ 313/506 |
| 2006/0186806 A1 | 8/2006 | Utsumi et al. |
| 2006/0284554 A1 | 12/2006 | Yotsuya |

FOREIGN PATENT DOCUMENTS

| | | |
|---|---|---|
| JP | A-8-83688 | 3/1996 |
| JP | A-11-329742 | 11/1999 |
| JP | A-2001-076864 | 3/2001 |

(Continued)

OTHER PUBLICATIONS

Yong-Jae Lee, et al., "A high-extraction-efficiency nanopatterned organic light-emitting diode", Applied Physics Letters, vol. 82, No. 21, May 26, 2003, pp. 3779-3781.*

*Primary Examiner*—Bumsuk Won
*Assistant Examiner*—Elmito Breval
(74) *Attorney, Agent, or Firm*—Oliff & Berridge, PLC (57) ABSTRACT

A light-emitting device includes a light-emitting element in which a first electrode layer, a functional layer having at least a light-emitting layer, and a second electrode layer are laminated. At least one of the first electrode layer and the second electrode layer has a light-transmissive electrode layer. A refractive material layer is provided at a side of the light-transmissive electrode layer not facing the functional layer. At a side of the refractive material layer not facing the light-transmissive electrode layer, a substrate formed with irregularities on a surface thereof abutting the refractive material layer is provided.

10 Claims, 4 Drawing Sheets

FOREIGN PATENT DOCUMENTS

| | | |
|---|---|---|
| JP | A-2003-86353 | 3/2003 |
| JP | A-2003-297572 | 10/2003 |
| JP | A-2004-022438 | 1/2004 |
| JP | A-2004-227811 | 8/2004 |
| JP | A-2004-363049 | 12/2004 |
| TW | I223969 | 11/1991 |
| TW | 200427366 | 5/1993 |

* cited by examiner

LIGHT-EMITTING DEVICE

BACKGROUND

1. Technical Field

The present invention relates to a light-emitting device having light-emitting elements such as organic electroluminescent (EL) elements.

2. Related Art

As a display device used in an electronic apparatus, such as a mobile phone, a personal computer, or a PDA (personal Digital Assistant), or an exposure head used in an image forming apparatus, such as a digital copying machine or a printer, a light-emitting device such as an organic electroluminescent (EL) device has been drawing attention.

The organic EL device includes light-emitting elements formed by stacking an anode layer, a functional layer having at least a light-emitting layer, and a cathode layer on a substrate, and light generated in the light-emitting layer is extracted to the outside.

Here, in the organic EL device, it is an important matter to improve the efficiency of extracting the light generated in the light-emitting layer to the outside. Therefore, a method in which irregularities are formed on an interface and a light scattering property is used so as to prevent the light extraction efficiency from being lowered due to total reflection of light has been proposed (e.g., see JP-A-2001-76864).

However, in the configuration disclosed in JP-A-2001-76864, there is a problem in that there is no preventive measure against the reflection of light which occurs on an interface of the anode not facing the light-emitting layer, so that the light extraction efficiency is not sufficiently high.

SUMMARY

An advantage of some aspects of the invention is that it provides a light-emitting device capable of improving light extraction efficiency by preventing the light extraction efficiency from being lowered due to the reflection of light.

According to an aspect of the invention, a light-emitting device includes a light-emitting element in which a first electrode layer, a functional layer having at least a light-emitting layer, and a second electrode layer are laminated. At least one of the first electrode layer and the second electrode layer has a light-transmissive electrode layer. In addition, a refractive material layer is provided at a side of the light-transmissive electrode layer not facing the functional layer. In addition, at a side of the refractive material layer not facing the light-transmissive electrode layer, a substrate formed with irregularities on a surface thereof abutting the refractive material layer is provided.

In the invention, preferably, the refractive index of the refractive material layer is larger than that of the light-transmissive electrode layer. Further, the refractive index of the refractive material layer may be 0.8 to 1 times that of the light-transmissive electrode layer. In any case described above, the refractive index of the refractive material layer is larger than the predetermined level.

According to the invention, when light generated in the light-emitting layer is transmitted through the light-transmissive electrode layer to be emitted toward the substrate, it is possible to prevent the reflection of light on an interface between the light-transmissive electrode layer and the refractive material layer because the light-transmissive electrode layer abuts the refractive material layer having a refractive index larger than the predetermined level. Further, the total reflection of the light having transmitted through the refractive material layer is prevented at the interface between the refractive material layer and the substrate due to the irregularities formed on the substrate. Accordingly, even though the refractive index of the substrate is smaller than that of the refractive material layer, the light is efficiently transmitted through the interface between the refractive material layer and the substrate. As a result, the light extraction efficiency is improved. On the other hand, when a reflective layer is formed at the interface between the refractive material layer and the substrate, the reflection direction of the light is varied due to the irregularities which affect the reflective layer, and accordingly, the incident angle of light with respect to the interface through which the light is transmitted until the light is emitted is corrected. Thereby, it is possible to prevent the light from being reflected from the interface. As a result, the light extraction efficiency is improved.

Further, in the invention, preferably, light generated in the light-emitting layer is emitted through the light-transmissive electrode layer, the refractive material layer, and the substrate.

In this case, when the light-transmissive electrode layer is an anode layer, the refractive material layer, the anode layer, the functional layer, and the cathode layer are laminated on the surface of the substrate formed with the irregularities. In the configuration described above, since the refractive material layer serves as a planarizing film with respect to the irregularities formed on the substrate, the light-emitting element can be formed on a planarized surface.

Furthermore, in the invention, preferably, when the light-transmissive electrode layer is a cathode layer, the surface of the substrate formed with the irregularities is bonded to the cathode layer by using the refractive material layer as a bonding layer therebetween. Therefore, by forming the irregularities on a sealing substrate which prevents the light-emitting element from being deteriorated due to moisture or oxygen, it is possible to prevent the light extraction efficiency from being lowered due to the reflection on the sealing substrate.

Furthermore, in the invention, preferably, when the light-transmissive electrode layer is a cathode layer, a color filter is formed on the surface of the substrate formed with the irregularities, and a surface of the substrate on which the color filter is formed is bonded to the cathode layer by using the refractive material layer as a bonding layer therebetween. In this case, it is preferable that the refractive index of the color filter be 0.8 times or larger than that of the refractive material layer.

More preferably, the refractive index of the color filter, the refractive index of the refractive material layer, and the refractive index of the light-transmissive electrode layer satisfy the following relationships:

refractive index of the light-transmissive electrode layer
$\leq$ refractive index of the refractive material layer
$\leq$ refractive index of the color filter.

Further, in the invention, preferably, when the light-transmissive electrode layer is a cathode layer, a color filter and a transparent resin layer are formed on the surface of the substrate formed with the irregularities in this order, and a surface of the substrate on which the transparent resin layer is formed is bonded to the cathode layer by using the refractive material layer as a bonding layer therebetween. In this case, it is preferable that the refractive index of the transparent resin layer be 0.8 times or larger than that of the refractive material layer and the refractive index of the color filter be 0.8 times or larger than that of the transparent resin layer.

More preferably, the refractive index of the color filter, the refractive index of the transparent resin layer, the refractive index of the refractive material layer, and the refractive index of the light-transmissive electrode layer satisfy the following relationships:

refractive index of the light-transmissive electrode layer
≦refractive index of the refractive material layer
≦refractive index of the transparent resin layer
≦refractive index of the color filter.

Furthermore, in the invention, preferably, a reflective layer on which the irregularities are reflected is formed between the substrate and the refractive material layer. In this case, light which is generated in the light-emitting layer and propagates toward the reflective layer is reflected from the reflective layer so as to be emitted from a side opposite to the substrate.

Furthermore, in the invention, preferably, when the light-transmissive electrode layer is an anode layer, the reflective layer, the refractive material layer, the anode layer, the functional layer, and the cathode layer are laminated on the surface of the substrate formed with the irregularities. In the configuration described above, since the refractive material layer serves as a planarizing film with respect to the irregularities formed on the substrate, the light-emitting element can be formed on a planarized surface.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the accompanying drawings. In the following description, a first electrode layer is assumed to be an anode layer and a second electrode layer is assumed to be a cathode layer. Further, in the drawings, individual layers and components are depicted in different scales so that they can be easily recognized in the drawings. In addition, the invention can be applied to any organic EL element having any color.

First Embodiment

Configuration of a Light-Emitting Device

Figure 1:
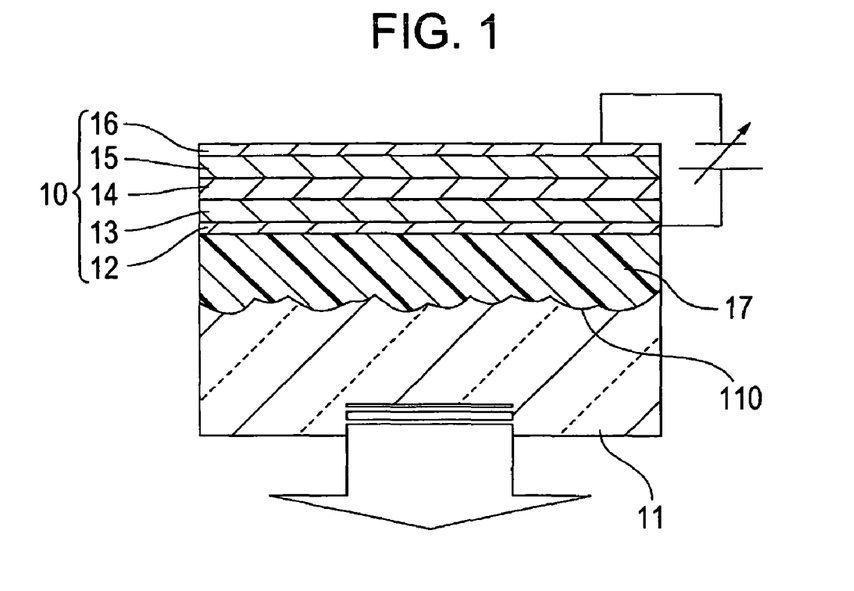
FIG. 1 is a cross-sectional view schematically illustrating a configuration of an organic EL element (light-emitting element) used in an organic EL device (light-emitting device) according to a first embodiment of the invention.

FIG. 1 is a cross-sectional view schematically illustrating the configuration of an organic EL element (light-emitting element) used in an organic EL device (light-emitting device) according to a first embodiment of the invention.

Referring to FIG. 1, an organic EL element 10 of an organic EL device 1 according to the present embodiment is configured such that a light-transmissive anode layer (light-transmissive electrode) 12 composed of an ITO or the like, a hole transport layer (functional layer) 13, a light-emitting layer (organic functional layer) 14, an electron transport layer 15, and a cathode layer 16 are laminated above a substrate 11 in this order. Here, since the organic EL device 1 is a bottom-emission-type device in which light is emitted from the substrate 11 side, a light-transmissive substrate, such as a glass or the like, is used as the substrate 11. Further, the cathode layer 16 is a layer composed of a reflective metal such as aluminum.

In the present embodiment, in the organic EL device 1 having the configuration described above, irregularities 110 are randomly formed on an upper surface of the substrate 11, and a refractive material layer 17 is formed on the surface of the substrate 11 in order to planarize the irregularities 110. In the present embodiment, the irregularities 110 are formed by performing a hydrofluoric acid treatment on the substrate 11, and the heights thereof are in the range of 0.01 to 0.5 µm.

The refractive material layer 17 is made of a high-refractive resin, and the refractive index of the refractive material layer 17 is 0.8 times or larger than that of the ITO making up the anode layer 12. In the present embodiment, the refractive indices of the respective layers with respect to light having a wavelength of 550 nm are as follows.

Refractive index nA of the anode layer (light-transmissive electrode) 12=1.95

Refractive index nB of the refractive material layer 17=1.80

Refractive index nC of the substrate 11 made of glass=1.54

Operations and Effects

In the organic EL element 10 of the light-emitting device 1 constructed as described above, when a current flows from the anode layer 12 to the cathode layer 16, the light-emitting layer 14 emits light according to the amount of current. Further, the light emitted from the light-emitting layer 14 is transmitted through the anode layer 12 and the substrate 11, while the light emitted from the light-emitting layer 14 toward the cathode layer 16 is reflected from the cathode layer 16 to be transmitted through the anode layer 12 and the substrate 11.

At this time, since the refractive index nB of the refractive material layer 17 is approximately 92% of the refractive index nA of the anode layer 12, about 85% of the light reaching an interface between the refractive material layer 17 and the anode layer 12 can be transmitted toward the refractive material layer 17.

Further, in the present embodiment, even though the refractive index nB of the refractive material layer 17 is larger than the refractive index nC of the substrate 11 made of glass, the irregularities 110 are formed on the interface between the substrate 11 made of glass and the refractive material layer 17. Accordingly, it is possible to prevent total reflection of light on the interface between the substrate 11 made of glass and the refractive material layer 17.

Therefore, as compared with an organic EL device of the related art which has no irregularity and of which emission efficiency is 10 cd/cm$^2$, it is possible to increase the emission efficiency up to 15 cd/cm² in the present embodiment. As a result, the light extraction efficiency can be improved.

Furthermore, when the organic EL device 1 according to the present embodiment is manufactured, the refractive material layer 17 made of resin is formed on a surface of the substrate 11 formed with the irregularities 110, and then the anode layer 12, the hole transport layer 13, the light-emitting layer 14, the electron transport layer 15, and the cathode layer 16 are laminated thereon in this order. Therefore, even when the irregularities 110 are formed on the substrate 11, the anode layer 12, the hole transport layer 13, the light-emitting layer 14, the electron transport layer 15, and the cathode layer 16 are formed on a surface planarized by the refractive material layer 17, so that the emission characteristic of the organic EL element 10 is not deteriorated or the reliability on the organic EL element 10 does not decrease.

Table 1 illustrates a simulation result on an emission efficiency when the refractive index nB of the refractive material layer 17 varies with the refractive index nA of the anode layer 12 set to 2.0. In addition, the emission efficiency when nB/nA varies is shown in Table 1, with an emission efficiency when the refractive index nA is equal to the refractive index nB as a reference. In addition, the present embodiment corresponds to nB/nA=0.95, and the related art corresponds to nB/nA=0.75.

TABLE 1

| nA | 2.0 | 2.0 | 2.0 | 2.0 | 2.0 | 2.0 | 2.0 | 2.0 | 2.0 | 2.0 |
|---|---|---|---|---|---|---|---|---|---|---|
| nB | 1.4 | 1.5 | 1.6 | 1.7 | 1.8 | 1.9 | 2 | 2.1 | 2.2 | 2.3 |
| nB/nA | 0.70 | 0.75 | 0.80 | 0.85 | 0.90 | 0.95 | 1.00 | 1.05 | 1.10 | 1.15 |
| efficiency | 0.49 | 0.56 | 0.64 | 0.72 | 0.81 | 0.90 | 1.00 | 1.00 | 1.00 | 1.00 |

As can be seen from Table 1, if the refractive index nB of the refractive material layer 17 is set to be 0.8 times or larger than the refractive index nA of the anode layer 12, it is possible to obtain an emission efficiency 0.56 times or larger than that in the reference condition, which improves the light extraction efficiency as compared with the related art. Further, if the refractive index nB of the refractive material layer 17 is set to be larger than the refractive index nA of the anode layer 12, the light extraction efficiency can be improved even more.

Second Embodiment

Figure 2:
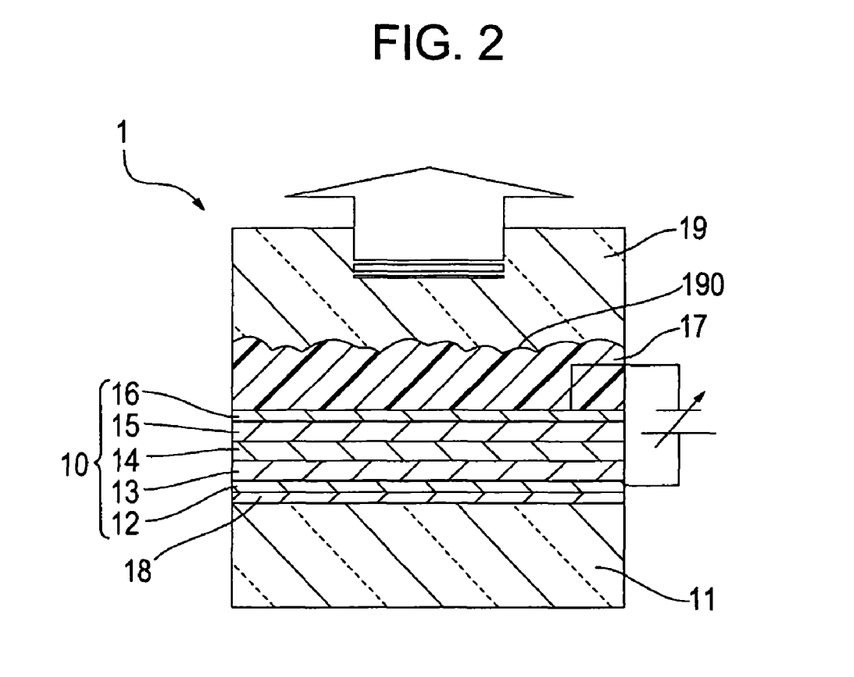
FIG. 2 is a cross-sectional view schematically illustrating a configuration of an organic EL element (light-emitting element) used in an organic EL device according to a second embodiment of the invention.

FIG. 2 is a cross-sectional view schematically illustrating the configuration of an organic EL element (light-emitting element) used in an organic EL device (light-emitting device) according to a second embodiment of the invention.

Referring to FIG. 2, an organic EL element 10 of an organic EL device 1 according to the present embodiment is configured such that a light-transmissive anode layer 12 composed of an ITO or the like, a hole transport layer (functional layer) 13, a light-emitting layer (organic functional layer) 14, an electron transport layer 15, and a cathode layer 16 are laminated above a substrate 11 in this order.

Here, since the organic EL device 1 is a top-emission-type device in which light is emitted from a side opposite to the substrate 11, a reflective layer 18 made of silver is provided between the substrate 11 and the anode layer 12. Further, the cathode layer 16 has a light-transmissive electrode composed of an ITO film. Furthermore, in the present embodiment, a sealing substrate 19 is bonded to a cathode layer 16 side.

In the present embodiment, in the organic EL device 1 having the configuration described above, irregularities 190 are randomly formed on a lower surface of the substrate 19, and the surface formed with the irregularities 190 faces the cathode layer 16. The irregularities 190 are formed by performing the hydrofluoric acid treatment on the substrate 19, and the heights thereof are in the range of 0.01 to 0.5 μm.

In the present embodiment, in order to bond the surface of the substrate 19 formed with the irregularities 190 to the cathode layer 16 side, a refractive material layer 17, which is made of resin and serves as a bonding material, is used. The refractive index of the refractive material layer 17 is 0.8 times or larger than that of the ITO making up the cathode layer 16. In the present embodiment, the refractive indices of the respective layers with respect to light having a wavelength of 550 nm are as follows.

Refractive index nA of the cathode layer (light-transmissive substrate) 12=2.00

Refractive index nB of the refractive material layer 17=1.80

Refractive index nC of the substrate 19 made of glass=1.54

In the organic EL element 10 of the light-emitting device 1 configured as described above, when a current flows from the anode layer 12 to the cathode layer 16, the light-emitting layer 14 emits light according to the amount of current. Further, the light emitted from the light-emitting layer 14 is transmitted through the cathode layer 16, the refractive material layer 17, and the substrate 19, while the light emitted from the light-emitting layer 14 toward the anode layer 12 is reflected from the reflective layer 18 to be transmitted through the cathode layer 16, the refractive material layer 17, and the substrate 19.

At this time, since the refractive index nB of the refractive material layer 17 is approximately 90% of the refractive index nA of the cathode layer 16, about 80% of the light reaching the interface between the refractive material layer 17 and the cathode layer 16 can be transmitted toward the refractive material layer 17. Further, in the present embodiment, the refractive index nB of the refractive material layer 17 is larger than the refractive index nC of the substrate 19 made of glass, and the irregularities 190 are formed on the interface between the substrate 19 and the refractive material layer 17. Accordingly, it is possible to prevent total reflection of light on the interface between the substrate 19 and the refractive material layer 17. As a result, as compared with an organic EL device of the related art which has no irregularity and of which emission efficiency is 9 cd/cm², it is possible to increase the emission efficiency up to 14.5 cd/cm² in the present embodiment, which improves the light extraction efficiency.

Further, preferably, if the respective indices satisfy the following condition, that is, nA≦nB, it is possible to completely prevent the reflection on the interface.

Third Embodiment

Figure 3:
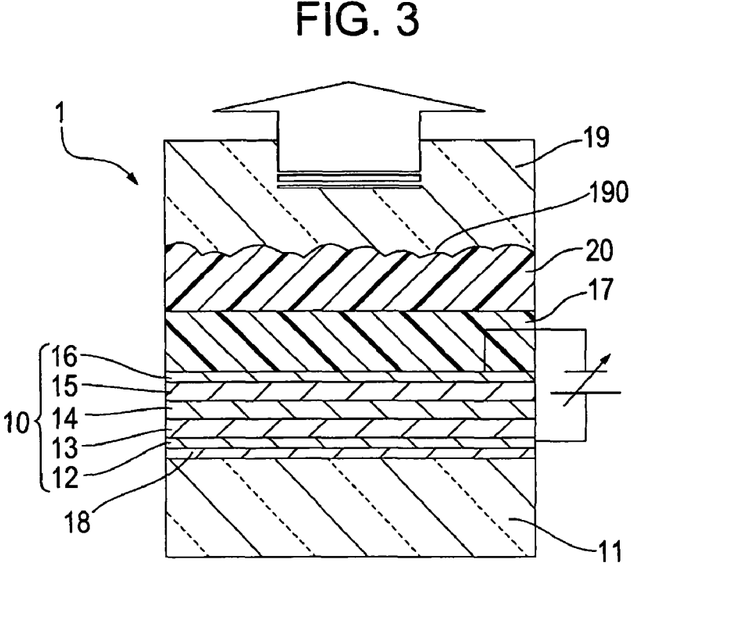
FIG. 3 is a cross-sectional view schematically illustrating a configuration of an organic EL element (light-emitting element) used in an organic EL device according to a third embodiment of the invention.

FIG. 3 is a cross-sectional view schematically illustrating the configuration of an organic EL element (light-emitting element) used in an organic EL device (light-emitting device) according to a third embodiment of the invention.

Referring to FIG. 3, an organic EL element 10 of an organic EL device 1 according to the present embodiment is configured such that a light-transmissive anode layer 12 composed of an ITO or the like, a hole transport layer (functional layer) 13, a light-emitting layer (organic functional layer) 14, an electron transport layer 15, and a cathode layer 16 are laminated above a substrate 11 in this order, in the same manner as in the second embodiment.

Here, since the organic EL device 1 is a top-emission-type device in which light is emitted from a side opposite to the substrate 11, a reflective layer 18 made of aluminum is provided between the substrate 11 and the anode layer 12. Further, the cathode layer 16 has a light-transmissive electrode composed of an ITO film. Furthermore, in the present embodiment, a sealing substrate 19 is bonded to a cathode layer 16 side.

In the present embodiment, in the organic EL device 1 having the configuration described above, irregularities 190 are randomly formed on a lower surface of the substrate 19, and the surface formed with the irregularities 190 faces the cathode layer 16. The irregularities 190 are formed by performing the hydrofluoric acid treatment on the substrate 19, and the heights thereof are in the range of 0.01 to 0.5 μm.

Further, a color filter 20 made of an acrylic resin is provided on the surface of the substrate 19 formed with the irregularities 190, and the surface of the substrate 19 provided with the color filter 20 is bonded to the cathode layer 16 by using a refractive material layer 17 as a bonding layer therebetween.

Here, the refractive index of the refractive material layer 17 is 0.8 times or larger than that of the ITO making up the cathode layer 16, and the refractive index of the color filter 20 is 0.8 times or larger than that of the refractive material layer 17. In the present embodiment, the refractive indices of the respective layers with respect to light having a wavelength of 550 nm are as follows.

Refractive index nA of the cathode layer (light-transmissive substrate) 12=2.00

Refractive index nD of the color filter 20=1.81

Refractive index nB of the refractive material layer 17=1.85

Refractive index nC of the substrate 19 made of glass=1.54

In the organic EL element 10 of the light-emitting device 1 configured as described above, when a current flows from the anode layer 12 to the cathode layer 16, the light-emitting layer 14 emits light according to the amount of current. Further, the light emitted from the light-emitting layer 14 is transmitted through the cathode layer 16, the refractive material layer 17, the color filter 20, and the substrate 19, while the light emitted from the light-emitting layer 14 toward the anode layer 12 is reflected from the reflective layer 18 to be transmitted through the cathode layer 16, the refractive material layer 17, the color filter 20, and the substrate 19.

At this time, since the refractive index nB of the refractive material layer 17 is approximately 92% of the refractive index nA of the cathode layer 16, about 85% of the light reaching the interface between the refractive material layer 17 and the cathode layer 16 can be transmitted toward the refractive material layer 17. Further, since the refractive index nD of the color filter 20 is approximately 97% of the refractive index nB of the refractive material layer 17, about 90% of the light reaching an interface between the color filter 20 and the refractive material layer 17 can be transmitted toward the color filter 20. Furthermore, in the present embodiment, the refractive index nD of the color filter 20 is larger than the refractive index nC of the substrate 19 made of glass, and the irregularities 190 are formed on the interface between the substrate 19 made of glass and the color filter 20. Accordingly, it is possible to prevent total reflection of light on the interface between the substrate 19 made of glass and the color filter 20. As a result, as compared with an organic EL device of the related art which has no irregularity and of which emission efficiency is 5 cd/cm$^2$, it is possible to increase the emission efficiency up to 8.1 cd/cm$^2$ in the present embodiment, which improves the light extraction efficiency.

Further, preferably, if the respective indices satisfy the following condition, nA≦nB≦nD, it is possible to completely prevent the reflection on the interface.

Fourth Embodiment

Figure 4:
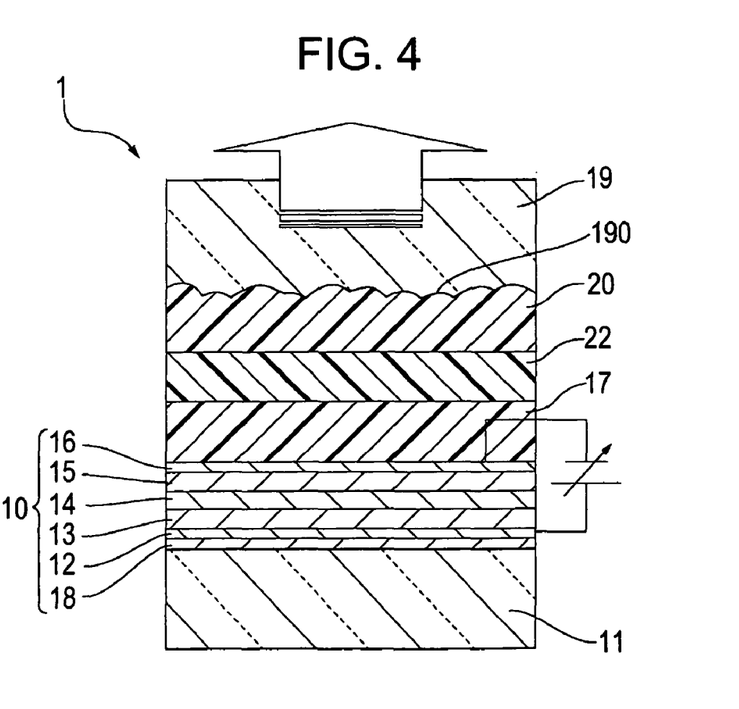
FIG. 4 is a cross-sectional view schematically illustrating a configuration of an organic EL element (light-emitting element) used in an organic EL device according to a fourth embodiment of the invention.

FIG. 4 is a cross-sectional view schematically illustrating the configuration of an organic EL element (light-emitting element) used in an organic EL device (light-emitting device) according to a fourth embodiment of the invention.

Referring to FIG. 4, an organic EL element 10 of an organic EL device 1 according to the present embodiment is configured such that a light-transmissive anode layer 12 composed of an ITO or the like, a hole transport layer (functional layer) 13, a light-emitting layer (organic functional layer) 14, an electron transport layer 15, and a cathode layer 16 are laminated above a substrate 11 in this order, in the same manner as in the second and third embodiments.

Here, since the organic EL device 1 is a top-emission-type device in which light is emitted from a side opposite to the substrate 11, a reflective layer 18 made of aluminum is provided between the substrate 11 and the anode layer 12. Further, the cathode layer 16 has a light-transmissive electrode composed of an ITO film. Furthermore, in the present embodiment, a sealing substrate 19 is bonded to a cathode layer 16 side.

In the present embodiment, in the organic EL device 1 having the configuration described above, irregularities 190 are randomly formed on a lower surface of the substrate 19, and the surface formed with the irregularities 190 faces the cathode layer 16. The irregularities 190 are formed by performing the hydrofluoric acid treatment on the substrate 19, and the heights thereof are in the range of 0.01 to 0.5 μm.

Further, a color filter 20 made of an acrylic resin and a transparent resin layer 22 serving as an overcoat layer are provided on the surface of the substrate 19 formed with the irregularities 190, and the surface of the substrate 19 provided with the transparent resin layer 22 is bonded to the cathode layer 16 by using a refractive material layer 17 as a bonding layer therebetween.

Here, the refractive index of the refractive material layer 17 is 0.8 times or larger than that of the ITO making up the cathode layer 16, the refractive index of the transparent resin layer 22 is 0.8 times or larger than that of the refractive material layer 17, and the refractive index of the color filter 20 is 0.8 times or larger than that of the transparent resin layer 22. In the present embodiment, the refractive indices of the respective layers with respect to light having a wavelength of 550 nm are as follows.

Refractive index nA of the cathode layer (light-transmissive substrate) 12=2.00

Refractive index nD of the color filter 20=1.81

Refractive index nE of the transparent resin layer 22=1.85

Refractive index nB of the refractive material layer 17=1.85

Refractive index nC of the substrate 19 made of glass=1.54

In the organic EL element 10 of the light-emitting device 1 configured as described above, when a current flows from the anode layer 12 to the cathode layer 16, the light-emitting layer 14 emits light according to the amount of current. Further, the light emitted from the light-emitting layer 14 is transmitted through the cathode layer 16, the refractive material layer 17, the transparent resin layer 22, the color filter 20, and the substrate 19, while the light emitted from the light-emitting layer 14 toward the anode layer 12 is reflected from the reflective layer 18 to be transmitted through the cathode layer 16, the refractive material layer 17, the transparent resin layer 22, the color filter 20, and the substrate 19.

At this time, since the refractive index nB of the refractive material layer 17 is approximately 92% of the refractive index nA of the cathode layer 16, about 85% of the light reaching the interface between the refractive material layer 17 and the cathode layer 16 can be transmitted toward the refractive material layer 17. Further, since the refractive index nB of the refractive material layer 17 is equal to the refractive index nE of the transparent resin layer 22 and the refractive index nD of the color filter 20 is approximately 97% of the refractive index nE of the transparent resin layer 22, about 90% of the light can be transmitted toward the color filter 20. Furthermore, in the present embodiment, the refractive index nD of the color filter 20 is larger than the refractive index nC of the substrate 19 made of glass, and the irregularities 190 are formed on the interface between the substrate 19 made of glass and the color filter 20. Accordingly, it is possible to prevent total reflection of light on the interface between the substrate 19 made of glass and the color filter 20. As a result, as compared with an organic EL device of the related art which has no irregularity and of which emission efficiency is 5 cd/cm$^2$, it is possible to increase the emission efficiency up to 8.1 cd/cm$^2$ in the present embodiment, which improves the light extraction efficiency.

Further, preferably, if the respective indices satisfy the following condition, nA≦nB≦nE≦nD, it is possible to completely prevent reflection on the interface.

Fifth Embodiment

Figure 5:
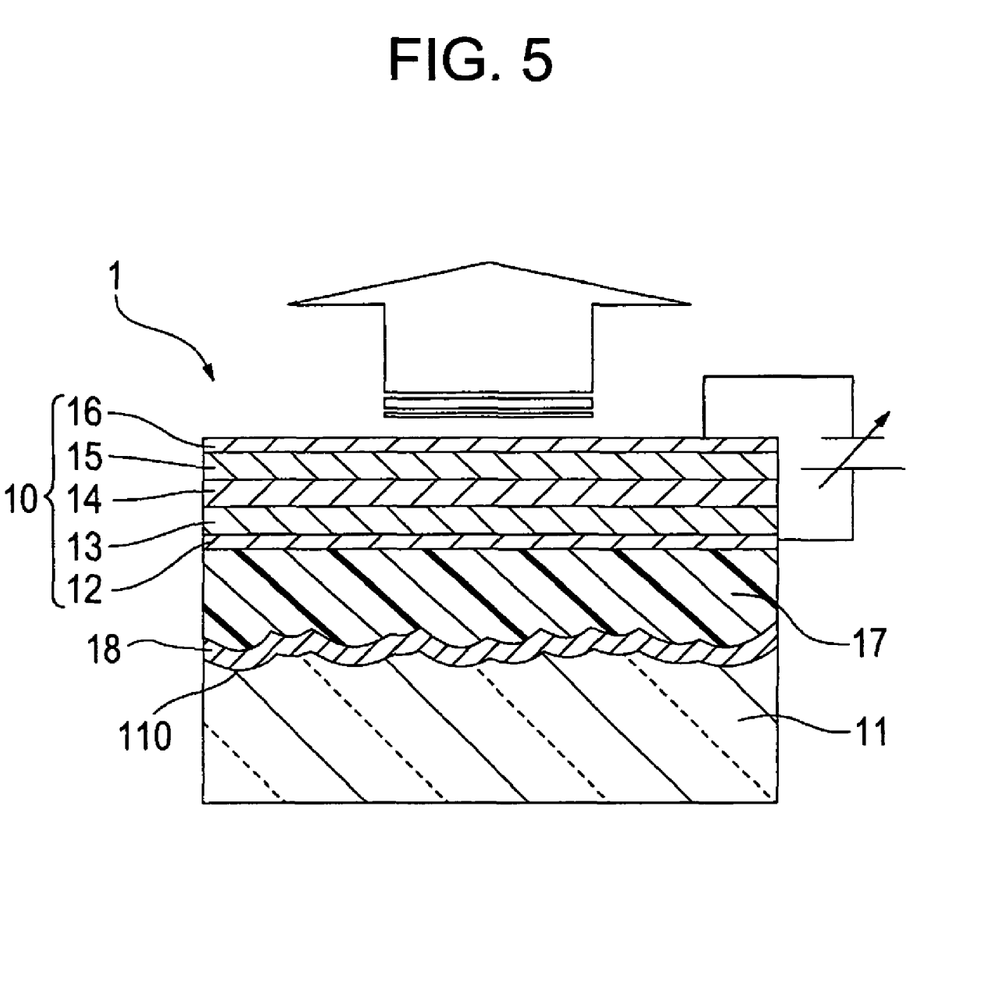
FIG. 5 is a cross-sectional view schematically illustrating a configuration of an organic EL element (light-emitting element) used in an organic EL device (light-emitting device) according to a fifth embodiment of the invention.

FIG. 5 is a cross-sectional view schematically illustrating the configuration of an organic EL element (light-emitting element) used in an organic EL device (light-emitting device) according to a fifth embodiment of the invention.

Referring to FIG. 5, an organic EL element 10 of an organic EL device 1 according to the present embodiment is configured such that a light-transmissive anode layer (light-transmissive electrode) 12 composed of an ITO or the like, a hole transport layer (functional layer) 13, a light-emitting layer (organic functional layer) 14, an electron transport layer 15, and a cathode layer 16 are laminated above a substrate 11 in this order.

In the present embodiment, in the organic EL device 1 having the configuration described above, irregularities 110 are randomly formed on an upper surface of the substrate 11.

Here, the organic EL device 1 is a top-emission-type device in which light is emitted from a side opposite to the substrate 11, and a reflective layer 18 made of a reflective metal, such as silver or aluminum, is provided on a surface of the substrate 11 formed with irregularities 110. Here, since the reflective layer 18 is affected by the irregularities 110, a refractive material layer 17 is formed on an upper surface of the reflective layer 18 so as to planarize the irregularities 110. In the present embodiment, the irregularities 110 are formed by performing the hydrofluoric acid treatment on the substrate 11, and the heights thereof are in the range of 0.01 to 0.5 μm.

The refractive material layer 17 is made of a high-refractive resin, and the refractive index of the refractive material layer 17 is 0.8 times or larger than that of the ITO making up the anode layer 12. In the present embodiment, the refractive indices of the respective layers with respect to light having a wavelength of 550 nm are as follows.

Refractive index nA of the anode layer (light-transmissive electrode) 12=2.00

Refractive index nB of the refractive material layer 17=1.80

Refractive index nC of the substrate 11 made of glass=1.54

In the organic EL element 10 of the light-emitting device 1 configured as described above, when a current flows from the anode layer 12 to the cathode layer 16, the light-emitting layer 14 emits light according to the amount of current. Further, the light emitted from the light-emitting layer 14 is transmitted through the cathode layer 16 and the substrate 19, while the light emitted from the light-emitting layer 14 toward the anode layer 12 is reflected from the reflective layer 18 to be transmitted through the cathode layer 16 and the substrate 19.

At this time, since the refractive index nB of the refractive material layer 17 is approximately 90% of the refractive index nA of the anode layer 12, about 80% of light reaching an interface between the refractive material layer 17 and the anode layer 12 can be transmitted toward the refractive material layer 17. Further, since the reflection direction of the light reflected from the reflective layer 18 is varied due to the irregularities 110 formed on the surface of the reflective layer 18, the incident angle of light with respect to the interface through which the light is transmitted until the light is emitted is corrected, and accordingly, it is possible to prevent the light from being reflected from the interface. Thereby, the light extraction efficiency is improved. As a result, as compared with an organic EL device of the related art which has no irregularity and of which emission efficiency is 8 cd/cm$^2$, it is possible to increase the emission efficiency up to 13 cd/cm$^2$ in the present embodiment, which improves the light extraction efficiency.

Furthermore, when the organic EL device 1 according to the present embodiment is manufactured, the reflective layer 18 and the refractive material layer 17 are formed on a surface of the substrate 11 formed with the irregularities 110, and then the anode layer 12, the hole transport layer 13, the light-emitting layer 14, the electron transport layer 15, and the cathode layer 16 are laminated thereon in this order. Therefore, even when the irregularities 110 are formed on the substrate 11, the anode layer 12, the hole transport layer 13, the light-emitting layer 14, the electron transport layer 15, and the cathode layer 16 are formed on a surface planarized by the refractive material layer 17, so that the emission characteristic of the organic EL element 10 is not deteriorated or the reliability on the organic EL element 10 does not decrease.

Other Embodiments

In the embodiments described above, the hydrofluoric acid treatment is performed so as to form the irregularities 110 and 190 on the substrates 11 and 19, respectively. However, a silicon oxide film, a silicon nitride film, or a photosensitive resin such as an acrylic resin may be used to form the irregularities 110 and 190.

Example Applied to a Display Device

The organic EL device 1 to which the invention is applied may be used as a passive-matrix-type display device or an active-matrix-type display device. Of those display devices, the active-matrix-type display device has an electrical configuration shown in FIG. 6.

Figure 6:
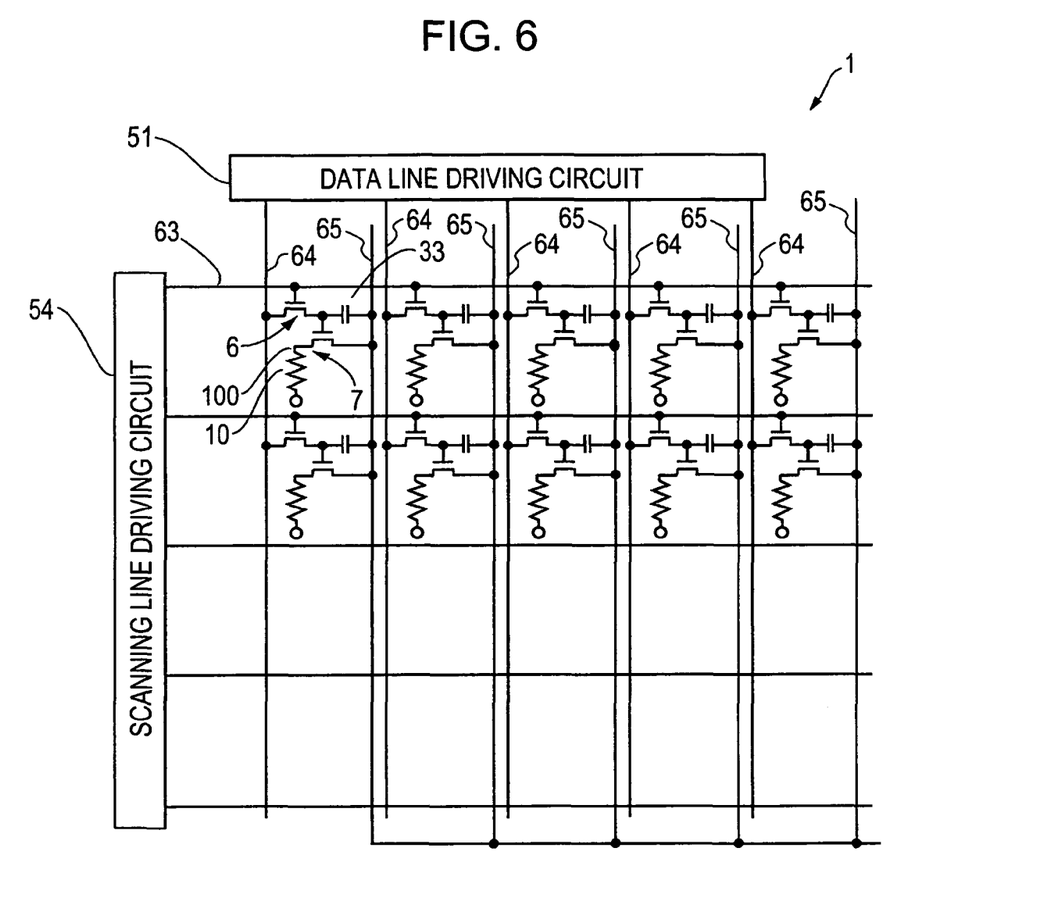
FIG. 6 is a block diagram illustrating an electrical configuration of an active-matrix-type organic EL device.

FIG. 6 is a block diagram illustrating the electrical configuration of an active-matrix-type organic EL device. In FIG. 6, the organic EL device 1 includes a plurality of scanning lines 63, a plurality of data lines 64 provided to extend in a direction crossing a direction in which the scanning lines 63 extend, a plurality of common feed lines 65 provided parallel to the data lines 64, pixels (light-emitting regions) 100 provided corresponding to intersections of the data lines 64 and the scanning lines 63. The pixels 100 are disposed in a matrix in an image display area. For the data lines 64, a data line driving circuit 51 having a shift register, a level shifter, a video line, and an analog switch is provided. For the scanning lines 63, a scanning line driving circuit 54A having a shift register and a level shifter is provided. In addition, each of the pixels 100 includes a pixel-switching thin film transistor 6 whose gate electrode is supplied with a scanning signal through corresponding one of the scanning lines 63, a holding capacitor 33 which holds an image signal supplied from corresponding one of the data lines 64 through the thin film transistor 6, a current control thin film transistor 7 whose gate electrode 43 is supplied with the image signal held by the holding capacitor 33, and an organic EL element 10 to which a driving current supplied from corresponding one of the common feed lines 65 flows when the organic EL element 10 is connected to the corresponding one of the common feed lines 65 through the thin film transistor 7. Further, in the organic EL device 1, each of the pixels 100 corresponds to one of the red (R), green (G), and blue (B) colors.

Other Embodiments

In the embodiments described above, the organic EL element is used as a light-emitting element. However, the invention may be applied to a light-emitting device using other light-emitting elements. In any cases, the invention is not limited to the above-mentioned embodiments, but various modifications and changes can be made within the scope and spirit of the invention.

Example Mounted on an Electronic Apparatus

The light-emitting device to which the invention is applied can be used as a display device used in various electronic apparatuses, such as a mobile phone, a personal computer, or a PDA. In addition, the light-emitting device to which the invention is applied may be used as an exposure head used in an image forming apparatus, such as a digital copying machine or a printer.

What is claimed is:

1. A light emitting device comprising: a glass substrate with a surface including irregularities; a color filter having first and second sides, being formed on the surface of the glass substrate, the first side of the color filter contacting the glass substrate, the second side of the color filter being opposite of the first side, a light-emitting element in which a first electrode layer, a functional layer having at least a light-emitting layer, and a second electrode layer are laminated, at least one of the first electrode layer and the second electrode layer having a light-transmissive electrode layer; a refractive material layer provided at a side of the light-transmissive electrode layer not facing the functional layer; and a transparent resin layer, the transparent resin layer and the color filter being formed on the surface of the glass substrate in this order, the color filter being formed between the transparent resin layer and the glass substrate such that the transparent resin layer does not contact the glass substrate, the second side of the color filter being planar and contacting the transparent resin layer, the light-emitting layer generating light that is emitted through the light-transmissive electrode layer, the refractive material layer, the color filter and the glass substrate, the light-transmissive electrode layer being a cathode layer, the refractive index of the transparent resin layer being 0.8 times or larger than that of the refractive material layer, and the refractive index of the color filter being 0.8 times or larger than that of the transparent resin layer; wherein the refractive index of the light-transmissive electrode layer is 2, the refractive index of the color filter is 1.81, the refractive index of the transparent resin layer is 1.88, the refractive index of the refractive material is 1.85 and the refractive index of the glass substrate is 1.54.

2. The light-emitting device according to claim 1,
the refractive index of the refractive material layer being larger than that of the light-transmissive electrode layer.

3. The light-emitting device according to claim 1,
the refractive index of the refractive material layer being 0.8 to 1 times that of the light-transmissive electrode layer.

4. The light-emitting device according to claim 1,
the light-transmissive electrode layer being an anode layer, and
the refractive material layer, the anode layer, the functional layer, and the cathode layer being laminated on the surface of the glass substrate.

5. The light-emitting device according to claim 1,
the light-transmissive electrode layer being a cathode layer.

6. The light-emitting device according to claim 1,
the light-transmissive electrode layer being a cathode layer, and
the refractive index of the color filter being 0.8 times or larger than that of the refractive material layer.

7. The EL display device according to claim 6,
the refractive index of the color filter, the refractive index of the refractive material layer, and the refractive index of the light-transmissive electrode layer satisfying the following relationships:
refractive index of the light-transmissive electrode layer
$\leqq$ refractive index of the refractive material layer
$\leqq$ refractive index of the color filter.

8. The light-emitting device according to claim 1,
the refractive index of the color filter, the refractive index of the transparent resin layer, the refractive index of the refractive material layer, and the refractive index of the light-transmissive electrode layer satisfying the following relationships:
refractive index of the light-transmissive electrode layer
$\leqq$ refractive index of the refractive material layer
$\leqq$ refractive index of the transparent resin layer
$\leqq$ refractive index of the color filter.

9. The light-emitting device according to claim 1,
a reflective layer on which the irregularities are reflected being formed between the substrate and the refractive material layer, and
light that is generated in the light-emitting layer and propagates toward the reflective layer being reflected from the reflective layer to be emitted from a side opposite to the substrate.

10. The light-emitting device according to claim 9,
the light-transmissive electrode layer being an anode layer, and
the reflective layer, the refractive material layer, the anode layer, the functional layer, and the cathode layer being laminated on the surface of the glass substrate.

* * * * *